United States Patent [19]

Watanabe

[11] Patent Number: 5,408,432
[45] Date of Patent: Apr. 18, 1995

[54] NON-VOLATILE SEMICONDUCTOR MEMORY DEVICE

[75] Inventor: Kazuo Watanabe, Tokyo, Japan

[73] Assignee: NEC Corporation, Tokyo, Japan

[21] Appl. No.: 130,452

[22] Filed: Oct. 1, 1993

[30] Foreign Application Priority Data

Oct. 1, 1992 [JP] Japan ................... 4-263752

[51] Int. Cl.[6] ........................................ G11C 16/06
[52] U.S. Cl. ................. 365/189.05; 365/185; 365/196
[58] Field of Search ............ 365/185, 189.05, 194, 365/195, 210, 205, 207, 196

[56] References Cited

U.S. PATENT DOCUMENTS

| 4,575,824 | 3/1986 | Tanaka et al. | 365/189.05 |
|---|---|---|---|
| 4,707,809 | 11/1987 | Ando | 365/189.05 |
| 5,051,955 | 9/1991 | Kobayashi | 365/189.05 X |
| 5,146,427 | 9/1992 | Sasaki et al. | 365/189.05 |

FOREIGN PATENT DOCUMENTS 0368310  5/1990  European Pat. Off. .

Primary Examiner—Joseph A. Popek
Attorney, Agent, or Firm—Sughrue, Mion, Zinn, Macpeak & Seas

[57] ABSTRACT

A non-volatile semiconductor memory device includes a sense amplifier (6) for detecting and outputting data of a memory cell comprising a non-volatile transistor (MO1, MO2), latch circuit (20) responsive to a latch signal for latching an output of the sense amplifier and inhibition means (10) responsive to a latch inhibition signal for inhibiting a latching operation of the latch circuit. With this construction of the memory device, correct data in the memory cell can be read without influence of noise in a circuit portion by detecting a verify mode automatically and monitoring a variation of a signal DO without using the latch circuit.

6 Claims, 3 Drawing Sheets

NON-VOLATILE SEMICONDUCTOR MEMORY DEVICE

BACKGROUND OF THE INVENTION

1. Field of the Invention

The present invention relates to a non-volatile semiconductor memory device and, particularly, to a non-volatile semiconductor memory device including a sense amplifier, for detecting and outputting data held in a memory cell, and a latch circuit, for latching an output of the sense amplifier, and performing a read operation at a high source voltage during a verify mode.

2. Description of the Related Art

A non-volatile semiconductor memory device is usually constructed with a memory cell array composed of a plurality of non-volatile memory cells each comprising a non-volatile memory cell MOSFET and a peripheral circuit for selecting one of the memory cells according to an input address and writing or reading the selected memory cell. The memory cell MOSFET includes a floating gate and a control gate, and stores data by charge accumulation in the floating gate. To write or program data in the memory cell MOSFET, a so-called programming voltage is used to accumulate charge to be stored in the floating gate. The memory cell MOSFET thus programmed has a threshold voltage higher than that of a non-programmed MOSFET.

The non-volatile semiconductor memory device constructed as mentioned above has a special mode called the "verify mode". The verify mode is a mode in which, immediately after data is written in a predetermined memory cell corresponding to an input address, the data is read from the same memory cell to confirm that the data is actually written in the memory cell. To this end a verifying voltage is applied to the control gate of that memory cell MOSFET and a sense amplifier is activated to detect the data actually written in the memory cell. If the memory cell is actually programmed, it maintains a non-conductive state against the verifying voltage supplied to the control gate thereof. If not, the memory cell MOSFET is rendered conductive by the verifying voltage. Thus, the verify mode is similar to a "read mode" in which data stored in a selected memory cell is read out therefrom by applying a reading-out voltage to the control gate of the selected memory cell. Needless to say, the programmed memory cell MOSFET is required not to be turned on by the reading-out voltage in the read mode. To this end, the verifying voltage, which is higher in potential level than the reading-out voltage, is applied to the memory cell MOSFET in the verify mode to confirm the programmed memory cell MOSFET is not turned on against such a relative high gate voltage.

As well known in the art, each of the reading-out voltage and the verifying voltage is derived from a power source voltage applied to the memory device and further has a potential level substantially equal to the power source voltage. That is, the power source voltage applied during the verify mode is higher than the power source voltage applied during the read mode. In a typical case, the power source voltage during the verify mode is 6.5 V, whereas the power source voltage during the read mode is in a range of 4.5–5.5 V.

Thus, a data read operation is performed in the verify mode in condition of receiving a relatively large power source voltage. This means that the charging and/or discharging of digit lines in the memory cell array is performed with the large power source voltage. In other words, a relatively large charging and discharging currents flow and cause the occurrence of large noise on the power source lines. For this reason, there is a possibility that the sense amplifier temporarily outputs an erroneous data due to the large noise. The output of the sense amplifier is latched by a latch circuit at a predetermined timing. Therefore, such erroneous data may be latched in the latch circuit. As a result, the data read is verified as if the erroneous data was written in the memory cell.

BRIEF SUMMARY OF THE INVENTION

Objects of the Invention

An object of the present invention is, therefore, to provide a non-volatile semiconductor device which, when read in the verify mode, outputs correct data without effect of noise.

Summary of the Invention

A non-volatile semiconductor memory device according to the present invention includes a sense amplifier for detecting and outputting data of a memory cell constructed with a non-volatile transistor, a latch circuit for latching an output of the sense amplifier, and an inhibition circuit for inhibiting a latching operation of the latch circuit at least during a verify mode.

Preferably, the inhibition circuit includes a circuit for generating a latch inhibition signal (CI) during the verify mode, the latch inhibition signal being in turn used for a latch disable signal to the latch circuit such that the latch circuit will not latch the input thereto.

Preferably, the latch circuit includes a locked inverter responsive to an output of the sense amplifier and operable in response to a latch signal supplied thereto, a hold circuit for holding an output of the clock inverter and control means responsive to the latch signal for controlling an activity of the hold circuit.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE INVENTION

Figure 1:
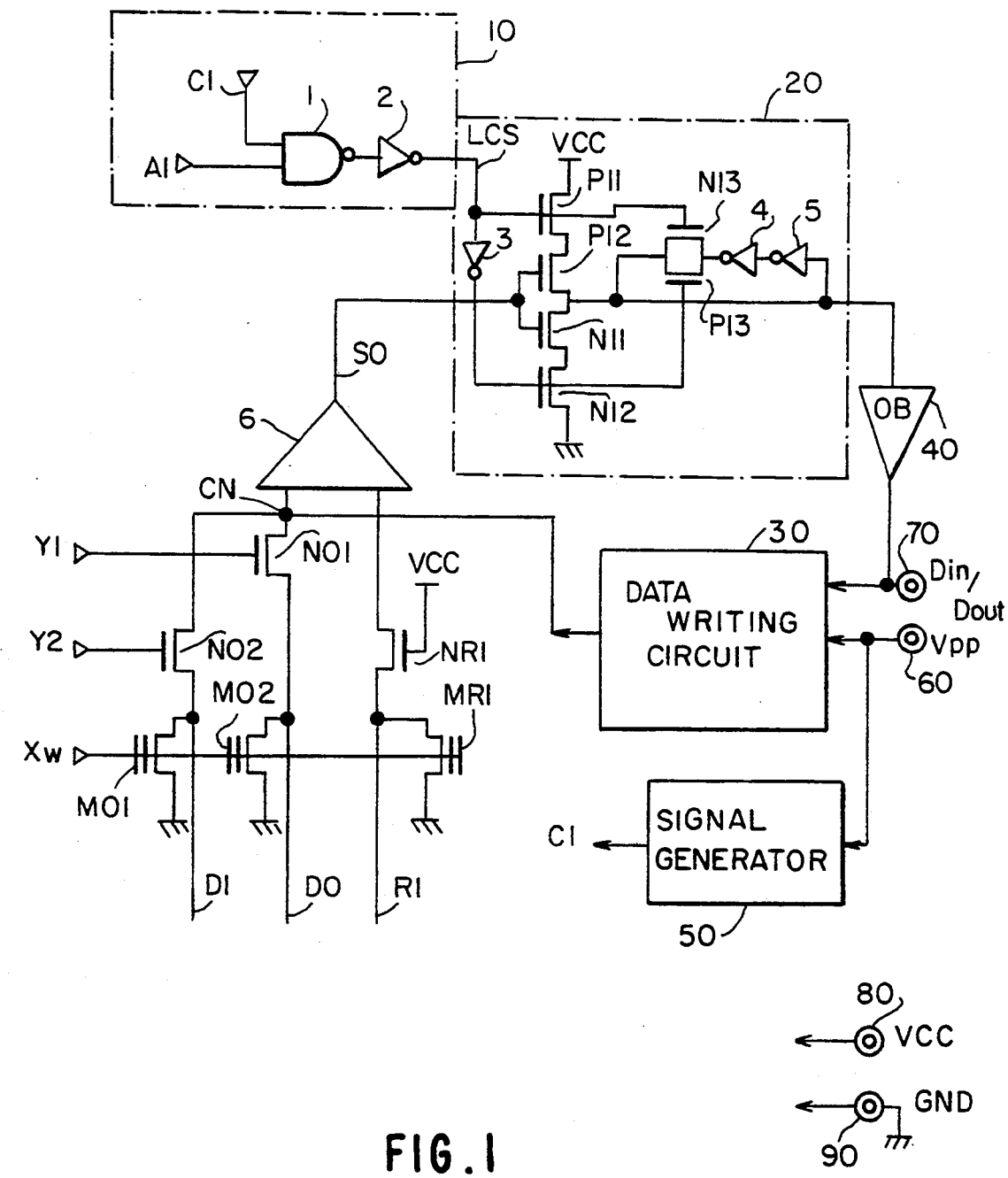
FIG. 1 is a circuit diagram of a non-volatile semiconductor device according to a first embodiment of the present invention.

Referring to FIG. 1 showing an embodiment of the present invention, a non-volatile semiconductor device includes a memory cell array composed of a plurality of memory cells each comprising a MOSFET having a floating gate and a control gate. For simplicity of description, only two memory cells, MOSFETs MO1 and MO2, and a reference memory cell, MR1, are shown in this embodiment.

The memory cells MO1 and MO2 are arranged between a ground power source and digit lines D0 and D1, respectively, and a word line Xw is connected to the control gates thereof. Therefore, one of the memory cells MO1 and M02 is connected electrically to a sense amplifier 6 when a predetermined word line is selected according to an input address and a predetermined gate transistor NO1 or NO2 is turned on by a digit line selection signals Y1 or Y2. The reference memory cell MR1 is also connected between the ground power source and a reference digit line R1 which is also connected to the sense amplifier 6 through a reference gate transistor NR1.

An output SO of the sense amplifier 6 is supplied to a latch circuit 20. A latching operation of the latch circuit 20 is controlled by a control signal LCS from a latch control circuit 10. The latch circuit 20 includes a clocked inverter composed of a series connection of a P-channel MOS transistor P12 and an N-channel MOS transistor N11 having gates to which the output SO is supplied and a P-channel MOS transistor P11 and an N-channel MOS transistor N12 having gates supplied with the control signal LCS from the latch control circuit 10 and the control signal inverted by an inverter 3, respectively. The series connection of the transistors P11, P12, N11 and N12 is connected between a power source voltage Vcc and a ground power source.

The latch circuit 20 further includes a loop circuit composed of a series connection of a pair of inverter circuits 4 and 5 supplied with an output of the clock inverter and a transfer gate composed of a P-channel MOS transistor P13 and an N-channel MOS transistor N13. The output SO' of the latch circuit 20 is supplied through an output buffer (OB) 40 to a data input/output terminal 70.

The latch control circuit 10 is composed a NAND gate 1 having inputs supplied with a latch signal AI and a latch inhibition signal CI, and an inverter 2 connected to an output of the NAND gate 1 to produce the control signal LCS.

The latch signal AI is generated in response to, for example, a change in level of a set of address signals (not shown) and indicates a timing of a latching operation of the latch circuit 20. The latch inhibition signal CI is generated from a signal generator 50 connected to a programming voltage terminal 60 supplied with a voltage Vpp. This voltage Vpp takes a programming voltage level (12.5 V) in a write mode and a verify mode. In a read mode, the voltage Vpp takes a potential level equal to a power source voltage Vcc supplied to a power terminal 80. As mentioned hereinbefore, the power source voltage Vcc takes a first potential level (4.5–5.5 V) in the read mode and a second potential level (6.5 V) in the write and verify modes. The ground voltage GND is applied to a terminal 90 as another power source voltage.

The terminals 60 and 70 are further connected to a data writing circuit 30. This circuit 30 is activated during the write mode and deactivated during the verify and read modes. The circuit 30, when activated, responds to the input data $D_{in}$ supplied to the terminal 70 and applies the programming voltage or the ground level to a common node CN to which the gate transistors N01 and N02 are connected in common. During this mode, the sense amplifier 6 is in a deactivated state.

In the verify and read modes, on the other hand, the sense amplifier 6 is activated.

Figure 2:
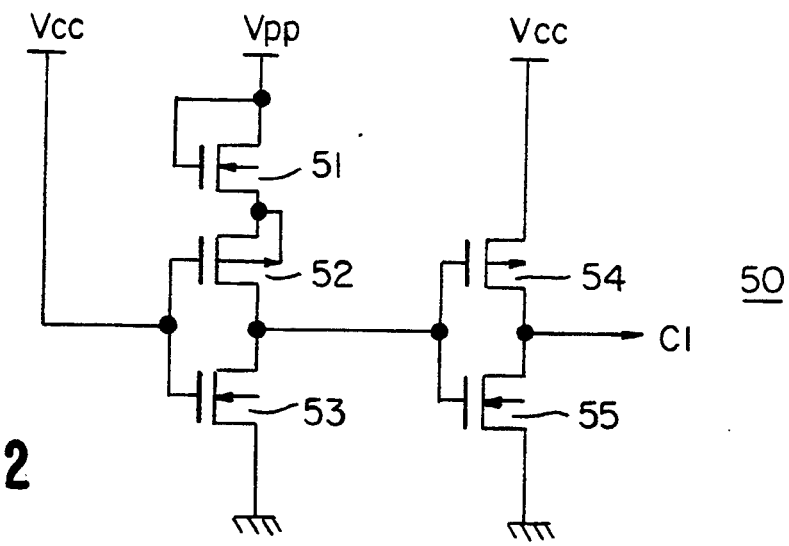
FIG. 2 is a circuit diagram indicative of a signal generator 50 shown in FIG. 1.

Turning to FIG. 2, the signal generator 50 includes two P-channel MOS transistors 52 and 54 and three N-channel MOS transistors 51, 53 and 55 which are connected as shown. As apparent from the connection among the respective transistors 51 to 55, the signal C1 takes an active low level when the programming voltage Vpp higher than the power source voltage Vcc is applied as represented by the write and verify modes. During the read mode in which the voltage Vpp is equal to the voltage Vcc, on the other hand, the signal C1 takes an inactive high level.

In operation, the memory device shown in FIG. 1 is brought first into the write mode. The data writing circuit 30 is thereby activated and the sense amplifier 6 is deactivated. Assuming that a set of address signals (not shown) designates the memory cell MOSFET M01, the word line Xw is raised up to the programming voltage Vpp and the gate transistor N02 is turned on by the selection signal $Y_2$. Also assuming that the input data $D_{in}$ of the logic "1" is supplied to the data terminal 70, the data writing circuit 30 produces the programming voltage Vpp which is in turn supplied to the memory cell M01 through the common mode CN and the gate transistor N02. The memory cell MOSFET M01 is thus programmed, the threshold voltage thereof being thereby shifted to a high value.

In order to confirm whether the memory cell MOSFET M01 is programmed, the memory device is then shifted to the verify mode. The data writing circuit 30 is thereby deactivated and all the internal states of the respective circuits are initialized. The voltage Vpp is held at the programming potential level, however.

Figure 3:
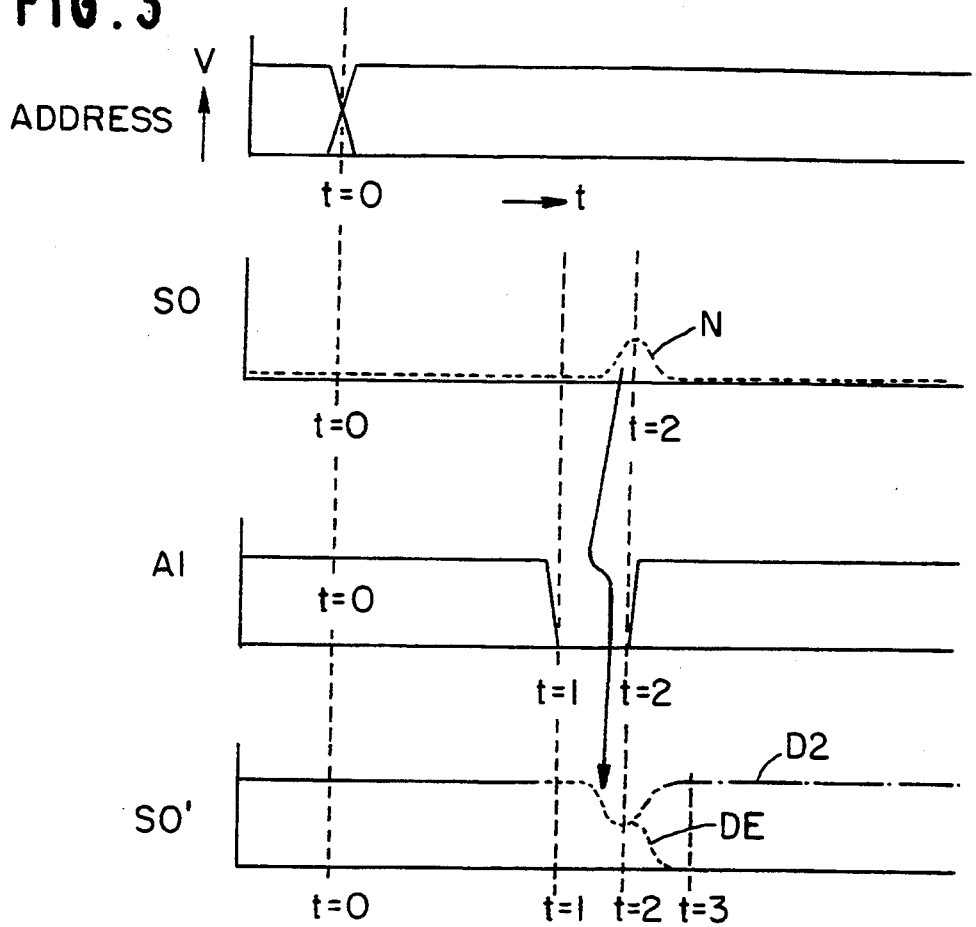
FIG. 3 shows waveforms for explaining operation of the semiconductor device shown in FIG. 1 during a verify mode of operation.

In order to designal the memory cell MOSFET M01, the set of address signals therefor is supplied at time t1 as shown in FIG. 3. In response thereto, the word line Xw is supplied with a verifying voltage that has a potential level substantially equal to the power supply voltage Vcc (6.5 V in this mode), and the gate transistor N02 is rendered conductive by the selection signal $Y_2$. Assuming that the memory cell MOSFET M01 is actually programmed, the MOSFET M01 is maintained in the non-conductive state against the verifying voltage. On the other hand, the reference memory cell MOSFET MR1 has a low threshold voltage, the verifying voltage turns the MOSFET MR1 on. A reference current thereby flows through a reference line.

Since the MOSFET M01 is in the non-conductive state, the sense amplifier 6 charges the digit line D1 up to a predetermined level. As mentioned before, the charging current is relatively large and causes the occurrence of a relatively large noise on the power source voltage lines. For this reason, the sense amplifier temporarily produces an erroneous output signal as shown by a dotted line N in FIG. 3.

It should be noted, however, that the latch inhibition signal C1 is held at the low level during the verify mode. Accordingly, even if the active low level latch signal AI is generated, this signal is disregarded and the control signal LCS from the latch control circuit 10 is held at the low level. The latch circuit 20 merely operates as an inverter and does not perform a latch operation. The output signal SO' from the latch circuit 20 is thereby temporarily changed toward the low level and then returned to the high level.

If the signal C1 would not be provided, as in the prior art memory device, the erroneous output signal N from the sense amplifier 6 would be latched by the latch circuit 20, so that the erroneous verified data SO' is outputted as shown by a dotted line DE in FIG. 3.

After the completion of the verify operation on the memory cell MOSFET M01, the memory device is returned to the write mode to program another memory cell MOSFET.

Figure 4:
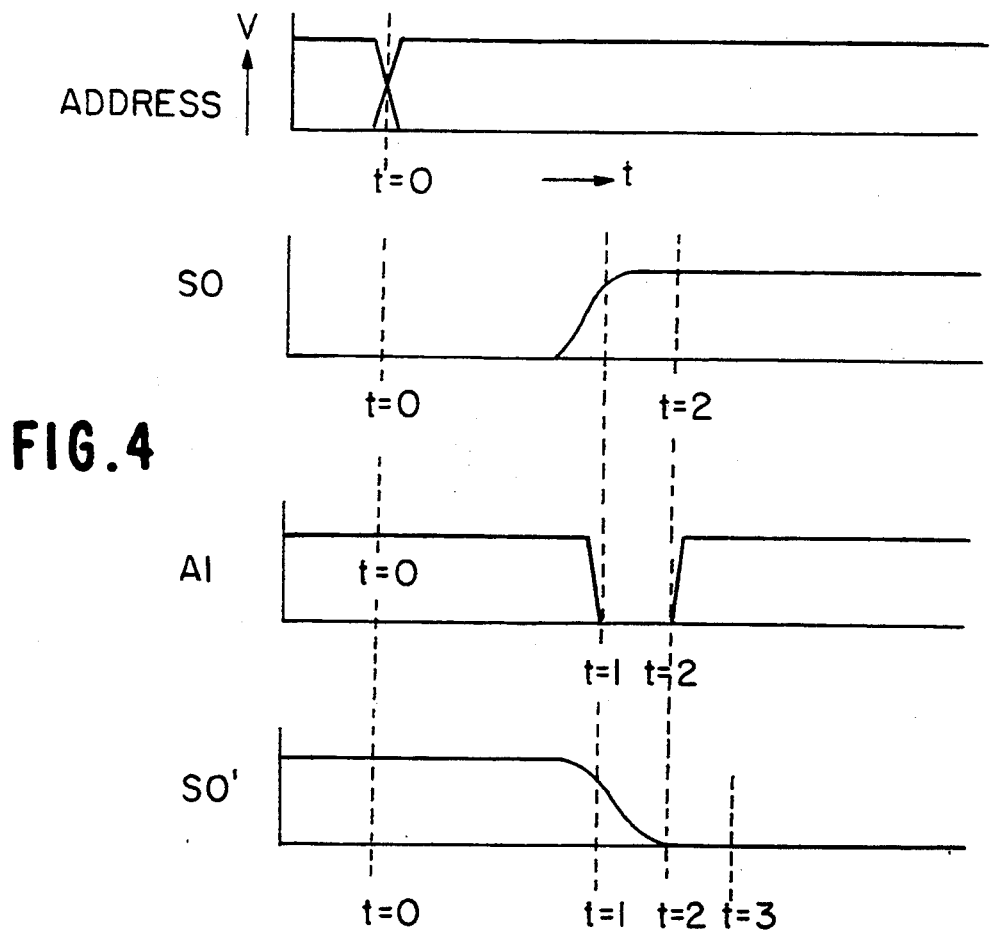
FIG. 4 shows waveforms for explaining operation of the semiconductor device shown in FIG. 1 during a normal read operation.

In read mode, both of the terminals 60 and 80 are supplied with a power source voltage Vcc of 4.5–5.5 V. The signal generator 50 thereby changes the signal C1 to the high level. A set of address signals for designating the memory cell MOSFET M02 is supplied at time t0 as shown in FIG. 4. In response thereto, the word line Xw is supplied with a reading-out voltage having a potential level of 4.5–5.5 V and the gate transistor N01 is turned ON. Assuming that the memory cell MOSFET M02 is not programmed, the MOSFET M02 is turned on. Although a predetermined current flows into the MOSFET M02 through the digit line D0, the digit line D0 is first charged to a predetermined level by the sense amplifier 6. Since the power source voltage Vcc during this mode is small as compared to the verify mode, only a small noise occurs on the power source lines. The reference memory cell MOSFET MR1 is also turned on. Since each of the memory cell MOSFETs M01, M02, MR1 and as forth is the same size as one another, the currents flowing through the lines D0 and R1 are equal to each other. The sense amplifier 6 therefore amplifies the currents flowing the digit line D and outputs a high level signal as shown in FIG. 4.

In response to the application of the address signals, the low active latch signal AI is generated after a predetermined time delay. In response thereto, the latch circuit 20 produces the inverted signal SO' of the output SO from the sense amplifier 6. By the latch signal AI being changed to the high level, the feedback loop including the inverters 4 and 5 and the transmission gate transistors N13 and P13 is activated to latch the output signal SO'.

According to the present invention constructed as mentioned above, the following advantages are obtained.

(1) Since it is possible to obtain memory cell data at the terminal SO' which is not influenced by noise during the verify mode, the reading of erroneous data in this mode can be judged as being caused by a process error such as incomplete cell structure, etc. On the other hand, in a case where erroneous data is output during a normal read while a read in the verify mode is correct, such case can be judged as being caused by noise in the circuit, etc. In the conventional checking in which only data stored in the latch circuit is used, such discrimination is impossible.

(2) In the conventional device, when, in order to measure a threshold voltage of a memory cell above which data is possible by gradually lowering a source voltage, amplification rate of a sense amplifier is lowered, so that data actually stored in a memory cell can not be stored in the latch circuit. In the present invention, however, a final data read from a memory cell is possible regardless of the amplification rate of a sense amplifier since a latch circuit is inoperative. Therefore, it is possible, according to the present invention, to know whether or not a memory cell can be written at a certain write voltage even if the latter voltage is very low.

Figure 5:
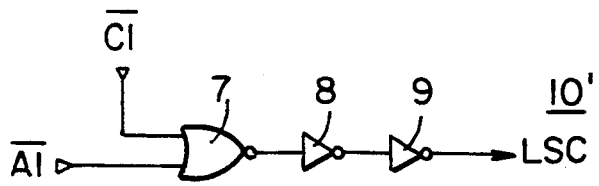
FIG. 5 is a circuit diagram indicative of a modification of a latch control circuit 10 shown in FIG. 1.

Turning to FIG. 5, a modified latch control circuit 10' includes a NOR gate 7 and inverters 8 and 9 to receive an inverted latch inhibition signal $\overline{CI}$ and an inverted latch signal $\overline{AI}$. Also in this configuration, the latch control signal LCS is maintained at the low level during the write and verify modes.

Since the power source voltage Vcc during the verify mode is different from that during the read mode, the signal generator 50 can detect the power source voltage Vcc to produce the signal CI.

What is claimed is:

1. A non-volatile semiconductor memory device which is alternatingly supplied with a first voltage and a second voltage higher than said first voltage, said memory device comprising:
 a memory cell array composed of a plurality of memory cells, means responsive to a set of address signals for selecting at least one memory cell, a sense amplifier for sensing and outputting data stored in a selected memory cell, a latch circuit responsive to a latch signal for latching an output of said sense amplifier, a signal generator for generating a detecting signal when said second voltage is supplied to said memory device, and latch inhibiting means responsive to said detecting signal for inhibiting a latch operation of said latch circuit irrespective of said latch signal.

2. The non-volatile semiconductor memory device claimed in claim 1, wherein said first voltage is a reading-out voltage which is used in a normal read-out mode, and said second voltage is a verifying voltage which is used in a verify mode.

3. The non-volatile semiconductor memory device claimed in claim 1, wherein said latch inhibiting means includes a logic gate supplied with said latch signal and said detecting signal.

4. The non-volatile semiconductor memory device claimed in claim 1, wherein said latch circuit includes a clocked inverter supplied with an output of said sense amplifier and operable correspondingly to said latch signal, and a loop circuit for holding an output of said clock inverter.

5. A non-volatile semiconductor memory device having a first mode in which a data read operation is performed under a first power voltage and a second mode in which said data read operation is performed under a second power voltage that is larger than said first power voltage, comprising:
 a sense amplifier for detecting and outputting data of a selected memory cell comprising a non-volatile transistor;
 a latch circuit coupled to said sense amplifier; and
 means for allowing said latch circuit to latch an output of said sense amplifier in said first mode and for inhibiting said latch circuit from latching the output of said sense amplifier in said second mode.

6. The non-volatile semiconductor memory device claimed in claim 5, wherein said latch circuit operates as an inverter in said second mode to output an inverted signal of said output of said sense amplifier.

* * * * *